United States Patent
Telmont et al.

(10) Patent No.: US 12,098,459 B2
(45) Date of Patent: Sep. 24, 2024

(54) PROMOTING ADHESION OF THIN FILMS

(71) Applicant: SY&SE SA, St.-Blaise (CH)

(72) Inventors: Florian Telmont, Peseux (CH); Sébastien Brun, Villiers (CH); Thierry Aellen, Neuchâtel (CH); Sophie Farine, La Chaux-du-Milieu (CH); Herbert Keppner, Colombier (CH)

(73) Assignee: SY&SE SA, St-Blaise (CH)

( * ) Notice: Subject to any disclaimer, the term of this patent is extended or adjusted under 35 U.S.C. 154(b) by 89 days.

(21) Appl. No.: 17/604,710

(22) PCT Filed: Apr. 20, 2020

(86) PCT No.: PCT/IB2020/053704
§ 371 (c)(1),
(2) Date: Oct. 18, 2021

(87) PCT Pub. No.: WO2020/212957
PCT Pub. Date: Oct. 22, 2020

(65) Prior Publication Data
US 2022/0195590 A1     Jun. 23, 2022

(30) Foreign Application Priority Data

Apr. 18, 2019 (CH) .................... CH0534/19

(51) Int. Cl.
C23C 14/58     (2006.01)
C23C 14/06     (2006.01)
C23C 16/56     (2006.01)

(52) U.S. Cl.
CPC ...... *C23C 14/5826* (2013.01); *C23C 14/0641* (2013.01); *C23C 14/5806* (2013.01); *C23C 16/56* (2013.01)

(58) Field of Classification Search
None
See application file for complete search history.

(56) References Cited

U.S. PATENT DOCUMENTS

| 8,580,355 B2 | 11/2013 | Durandeau et al. |
| 2002/0054962 A1* | 5/2002 | Huang .................. C23C 16/325 427/535 |
| 2008/0180890 A1 | 7/2008 | Bolis |
| 2011/0050043 A1 | 3/2011 | Sugiyama |

(Continued)

FOREIGN PATENT DOCUMENTS

| CN | 101998937 | 3/2011 |
| JP | H-05/80163 A | 4/1993 |
| JP | H-08/166469 A | 6/1996 |

(Continued)

OTHER PUBLICATIONS

Collins et al. Optimization of Anodic Bonding to MEMS with Self-Assembled Monolayer Coatings with Self-Assembled Monolayer (SAM) Coatings. Proceedings of SPIE vol. 4558 (2001) (Year: 2001).*

(Continued)

*Primary Examiner* — Jose I Hernandez-Kenney
(74) *Attorney, Agent, or Firm* — Blank Rome LLP

(57) ABSTRACT

The invention relates to a method for adhesion of a thin film or functional layer to a substrate by applying a pulsed and/or alternating voltage.

13 Claims, 1 Drawing Sheet

(56) References Cited

U.S. PATENT DOCUMENTS

2014/0295642 A1    10/2014  Fournel
2018/0188692 A1*    7/2018  Brun .................... G04B 39/025

FOREIGN PATENT DOCUMENTS

| JP | H9-2845 | 1/1997 | |
|---|---|---|---|
| WO | WO-2015/104252 A2 | 7/2015 | |
| WO | WO-2017/006219 A1 | 1/2017 | |
| WO | WO-2017006218 A1 * | 1/2017 | ............. C03C 27/00 |

OTHER PUBLICATIONS

International Search Report for PCT/IB2020/053704, dated Jul. 7, 2020, 2 pgs.

* cited by examiner

PROMOTING ADHESION OF THIN FILMS

REFERENCE DATA

The present application is a national phase of International patent application PCT/IB2020/053704, filed Apr. 20, 2020, which claims priority to Swiss Application No. CH0534/19, filed Apr. 18, 2019. The entire contents of these applications are hereby incorporated by reference.

TECHNICAL FIELD

The present invention relates to a process for promoting the adhesion of a thin layer on a substrate. Particularly but not exclusively, the present invention relates to a process for promoting the adhesion between a substrate which is metallic, but not exclusively, and a thin layer, for example a PVD layer, a galvanic layer, or a layer of a different nature, with the application of an electric field.

The specificity and the objective of the present invention are to produce a diffusion of chemical species at the interface between the substrate and the thin layer, bringing better adhesion, restructuring of the layer as well as the creation of a composite material at the interface.

Among its multiple industrial applications, the present method allows the adhesion of thin layers in medical devices, on cutting tools, in the production of photovoltaic modules, of display screens, of semiconductors, improves the quality of antireflective coatings applied onto windowpanes, onto spectacle lenses, or onto optical elements, and increases the strength of decorative layers applied onto a multitude of objects.

PRIOR ART

In general, the elements bonded together to make up the objects that surround us, whether in usual objects or highly technological systems in fields such as mechanics, electronics, optics or control or analysis devices, are provided with a coating.

The functionality of the coating, which confers the essential characteristics on the function or is simply adapted to the requirements of a particular need, is highly related to its adhesion properties. A surface preparation can be carried out to guarantee the adhesion of a coating, said surface preparation being by means of a plasma or a chemical solution before the coating is deposited, or mechanically. There are also treatments once the coating has been deposited, for example curing processes, as a means of increasing the diffusion of the two materials at the interface and allowing better bonding between the coating and the object.

The temperature during deposition of the coating also influences the properties of the coating and its adhesion; for this reason, for example, high-temperature CVD technology is preferred for the deposition of coatings of optics for high-energy lasers or mechanical components subjected to high stress in the motor vehicle industry, compared to the PVD process.

Furthermore, the adhesion and the creation of a composite material at the interface has the effect of increasing the reliability and the aging of the system.

In terms of substrate, industry is now turning to materials that are lighter than the conventional steels, i.e., high elastic limit (HEL) steel, very high elastic limit (VHEL) steel, and metals and alloys such as aluminum, magnesium or titanium, and, concurrently, to the development of composites with an organic matrix for lightening the current devices (already the case with the automobile industry). Use may also be made of the deposition of a metallic coating on light substrates by cold spray in order to facilitate the deposition method while at the same time obtaining characteristics close to high density metals.

The anodic bonding process is used in the general field of microfabrication, more particularly in the biomedical, aerospace and electronics sectors. In these fields, especially in microelectronics and related fields, anodic bonding operations are especially used for thin flat films and layers such as, for example, metal strips, glass sheets and silicon wafers. Since the process requires relatively high temperatures, it is generally used to bond together materials with close coefficients of thermal expansion, in order to limit the stresses linked to the differences in contraction.

In the known art, anodic bonding is mainly reserved for jointing glass, in particular Pyrex® glass or Borofloat® glass (borosilicate glass).

Based on the same principle of stress limitation, anodic bonding of small size and of low mass or of elements not subjected to external mechanical forces has been described in the watchmaking sector in document JP08166469A, for attaching a glass plate to a metal or silicon dial. Patent JP05080163A also describes the attaching of silicon indices affixed onto a glass plate of the dial by anodic bonding. The known processes do not however make it possible to bond together bulky components subjected to high mechanical stresses and which must withstand impacts, particularly if the parts to be joined are made with heterogeneous materials, with dissimilar coefficients of expansion, as is the case for stainless steel and sapphire used to make watch glasses.

WO2017006219 describes a low-temperature anodic bonding process involving an electric field with a pulsed or alternating component.

In the known art, many processes for depositing thin layers are also known for several functions, for example anti-wear layers on cutting tools, decorative layers giving a surface an attractive color, antireflection, conductive, hydrophilic, hydrophobic, oleophobic, photovoltaic, semiconductive layers, and many others. The thin layers can be deposited via a variety of processes, including physical vapor deposition (PVD) processes, chemical vapor deposition (CVD) processes, sol-gel processes, galvanic methods, by spin-coating, electrospinning, plasma torch depositions, and the like.

There are also several known processes aimed at improving the adhesion between the substrate and the deposited layer, for example by interposing intermediate layers, referred to as tie layers, or by preparation and careful cleaning of the surfaces. Despite that, delamination of the layer from the substrate cannot always be avoided.

SHORT SUMMARY OF THE INVENTION

An object of the present invention is to provide a process for improving the adhesion of a thin layer on a substrate compared to known thin layers. Advantageously, the process is carried out at low temperature, much lower than the transition temperatures or melting points of the materials used.

According to the invention, these objectives are achieved in particular by means of the subject matter of claim 1.

BRIEF DESCRIPTION OF THE FIGURES

Examples of implementation of the invention are indicated in the description shown by the appended figures in which.

EXAMPLE(S) OF AN EMBODIMENT OF THE INVENTION

In one embodiment that will subsequently be described in detail, the process of the invention is applied to the adhesion of a thin layer 23 on a substrate 20. The layer 23 could for example be an anti-wear layer made of TiN on a cutting tool, or a colored layer, or a bio-ceramic layer, that is to say a ceramic having a composition similar to that of an organic tissue, on a dental implant, or any other functional or decorative layer.

The layer 23 can be applied by any chemical or physical process, for example by physical vapor deposition (PVD), chemical vapor deposition (CVD), plasma-enhanced chemical vapor deposition (PE-CVD), atomic layer deposition (ALD), plasma torch, electrospinning, spraying, various galvanic processes, sol-gel processes, and many others. The layer 23 may be insulating, semi-conductive, or conductive, crystalline (monocrystalline, polycrystalline or, for polymers, semi-crystalline), or amorphous.

Figure 1:
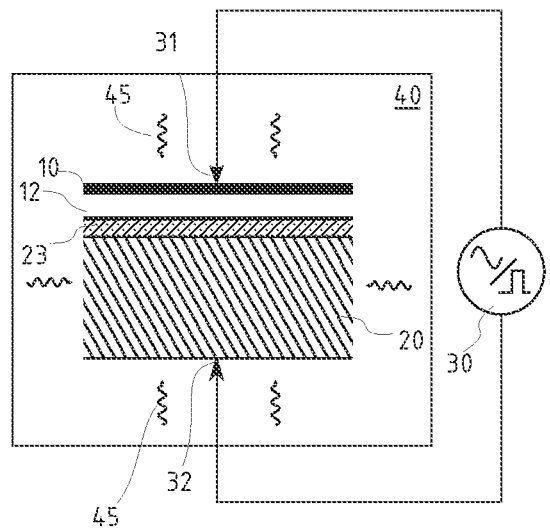
FIG. 1 shows schematically a bonding device which makes it possible to implement the process of the invention.

The invention can be applied to the bonding together of a variety of objects or components. The description will be understood more clearly with reference to FIG. 1 which represents, in section, an anodic bonding device.

The part 20 is intended to receive the functional or decorative layer 23. The substrate 20 can be produced with all the materials normally used. Mention may be made, for example, of:
a) stainless steel,
b) gold, or gold-based alloys,
c) platinum,
d) titanium,
e) aluminum,
f) ceramic,
g) glass,
h) polymer,
i) composite materials,
this list is not exhaustive.

The part 20 can be produced by any known process, for example by machining, stamping, 3D printing, or any other process. It is not important for the face intended to receive the layer 23 to be perfectly flat, since the layer is deposited by a process which will allow it to perfectly follow the shape of the substrate in intimate contact.

It has been found that the process of the invention does not require a homogeneous chemical composition of the layer 23. Quite the opposite, layers having a chemical and/or oxidation gradient have given better results in terms of adhesion, solidity of the bond and rapidity of bonding together. In a typical case involving a titanium layer, the layer 23 has a thickness ranging from 1 nm to 10 µm and its composition varies from pure titanium, in the deepest regions, to the oxide $TiO_2$ at the surface, while passing through all the intermediate stoichiometries. As will subsequently be seen, this chemical gradient can be accentuated with exposures to a reactive plasma.

Several materials lend themselves to the deposition of the layer 23. Titanium layers, as mentioned above, have given excellent results, but the invention can be replicated with other materials, for example Zr, Hf, Fe, Si, Al, among others. The chemical gradient can be obtained by oxidation, nitridation or carburization, for example, in which case the composition of the layer may be of $Ti_xO_y$, $Si_xO_y$, $Si_xN_y$, $Al_xO_y$, or $Zn_xO_y$ type. The layer 23 can be enriched with mobile atoms/ions, such as Li, Na, K, Ca or Be, or halogens. It is possible to make layers of bio-ceramic, for example of hydroxyapatite, the main mineral component of dental enamel, of dentine and of bone, adhere on the substrate 20.

The invention is also not limited to metallic or conductive substrates, but it has been successfully applied also to semi-conductive elements, such as elements of photovoltaic panels, or to insulating substrates such as glass or corundum. It is for example possible to make antireflective, polarizing layers, or transparent conductive layers adhere to a transparent element, for example ITO electrodes on a touch screen or on an LCD screen.

FIG. 1a represents very schematically a bonding device which makes it possible to carry out the inventive process. The substrate 20 bears a layer 23 on one face, and the electrode 10 is positioned on the layer 23 in a chamber 40. Heating means 45 make it possible to maintain the parts at a desired temperature. Characteristically, the invention is carried out at temperatures below those of conventional anodic bonding processes. The temperature is preferably below 250° C. Very satisfactory results have been obtained at temperatures of 200° ° C., 150° ° C., 100° ° C., and even 75° C. Under no circumstances will the temperature be close to that of the melting point or the glass transition temperature of the materials used.

The electrode 10 is connected to a circuit 31 and the substrate is connected to a counter electrode 32, between which is connected a voltage source 30. The voltage source produces an electric field which causes migration of ions between the elements 20, 23, 10.

The voltage generated by the source 30 comprises a direct component (its average value) within the limits of what is generally used in anodic bonding processes, i.e. in the range 0.1-50 kV or more, depending on the thickness of the parts to be joined and the dielectric rigidity of the assembly. It has been found that the quality of the adhesion improves considerably when an AC or pulsed component is superimposed on the direct component. The amplitude of the AC component or the height of the pulses will be comparable to that of the direct component, and the characteristic frequency will be higher than 100 Hz, for example 1 kHz, 10 kHz, or more. Characteristically, the frequency of the AC component or of the pulses will be higher than the dielectric relaxation frequencies of the materials used.

If required, the parts 20, 10 can be mechanically compressed. However, it has been found that such pressing is often superfluous. The assembly rates are of the order of a few minutes.

Between the layer 23 and the substrate 20, it is possible to deposit thin layers with an esthetic or antireflective function (if the substrate 20 is transparent, for example), or in order to improve the adhesion, or for any other purpose. These additional layers are not represented in the figures. The transition between the materials of the layers may be discontinuous or gradual.

Any charged particle placed under the influence of a uniform electric field moves at a speed proportionally to this field, the proportionality factor being referred to as the electric mobility of the particle. This migration will take place from the anode to the cathode for positively charged particles, and in the opposite direction for negatively charged particles. Under the effect of the ion migration, a difference in potential is observed between the partners, which causes the partners to press together by electrostatic attraction. The disruption of the thermodynamic equilibrium influences the populations of charge carriers located within the parts to be bonded together and the intermediate layer. The disruptions may be caused by:

nonuniformities in terms of doping, of impurities, of structural defects and local deformations (mainly in the region of the surface), contacts and junctions the electric field forces the temperature gradients.

When the electric field and also the temperature are interrupted, the charge carriers tend toward a state of equilibrium corresponding to permanent regimes defined by initial conditions and at the edges, according to typical mechanisms:

diffusion of the carriers in concentration gradients movement of the carriers in internal electric fields generation and recombination of carriers which may be intrinsic or may involve recombination centers and traps.

The properties relating to electrical currents and to movements of charge carriers under the influence of applied forces are called transport phenomena. Among transport phenomena, mobility, whether it is for example voids, impurities, charge carriers (the materials are differentiated by the Debye length of the major carriers and their behavior is in particular described by the continuity equation), and also diffusion (based on Fick's laws) are key mechanisms of anodic bonding.

The parameters which have the most influence on the mobility of the charge carriers are the temperature, the nature of the network and the number by volume of impurities. Among the defects, a distinction may be made between impurities and voids. It is these same voids, Schottky defects or Frenkel defects, inter alia, which facilitate the diffusion of the charge carriers and define the energy required for their diffusion. Furthermore, moving a void through a crystal demands much less work than forcing an ion to move through a dense ion network of a crystal. Ionic conduction depends on the movement of the voids. The impurities which contribute to the density of charge carriers are called "donors" if they provide additional electrons and "acceptors" if they provide additional holes. It should be noted that the speed of the anodic bonding phenomenon depends on the number of defects and on the temperature in particular.

The choice of the intermediate layer(s) depends greatly on the "properties" of the charge carriers. The chemical composition of the layer(s) is naturally important since the transport phenomena depend on the characteristics of the atomic bonds. The bonds created during the anodic bonding process are mainly covalent-type bonds. These strong bonds are established by the coming together of a pair of electrons from each of the charge carriers.

Other parameters are of importance, such as the thickness of the parts to be bonded together as well as the thickness of the depletion zone.

Figure 2:
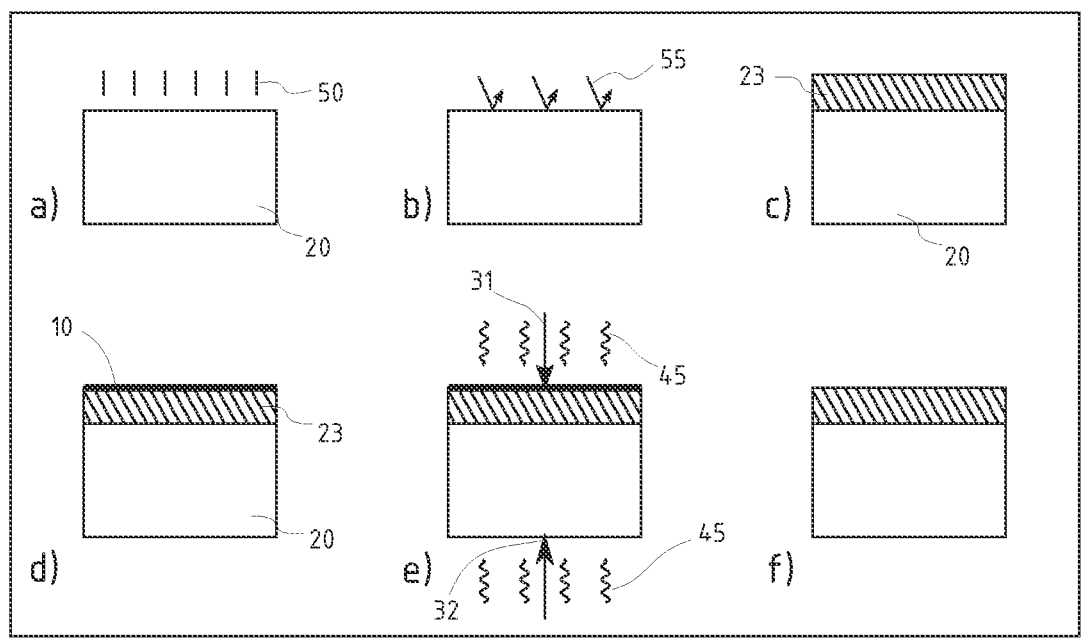
FIG. 2 shows steps of the inventive process.

FIG. 2 represents schematically a succession of steps of the inventive process. The part 20, secondarily machined and/or polished is first cleaned (step a) by leaching baths, or by ultrasound, or by any appropriate washing process 50. Next (step b), a functional or decorative layer is created by PVD deposition 55, as was discussed above, or by any other suitable process. Step c) represents the element 20 with the activated intermediate layer 23.

The surface(s) to be joined are preferably activated by reactive plasma bombardment (not represented). The chemical and physical characteristics of the plasma will be selected as a function of the desired chemistry for the intermediate layer. Oxygen plasmas applied to layers of titanium or of steel have given very satisfactory bonding together in terms of solidity and rapidity. The activation takes place, preferably, in the same reactor in which the deposition 55 is carried out.

The activated surfaces are sensitive to air, so for this reason it is preferable to complete the bonding together rapidly after step d). The elements 23 and 20 are brought into contact and heated (step e), then the electric field is applied by the electrodes 10, 31, 32 (step f) for a determined time, until the anodic bond is obtained. Finally, the electrode 10 is removed.

In one variant of the invention, the electrode 10 is a strip of an insulating material, for example an electrode made of ceramic, of glass, or of a crystalline material, optionally with an equipotential conductive layer on the back.

The process of the invention can be carried out with the electrode 10 in contact with the layer 23, optionally with a greater or lesser bearing force. Such pressing together is not however essential; good results (considerable improvement in adhesion between substrate 20 and thin layer 23) have been obtained even when the electrode 10 and the layer 23 remain separated by an empty space 12 during the application of the electric field. The empty space 12 can range from 0 to 20 mm or more.

EXAMPLE

The beneficial effects of the process of the invention were verified on a sample composed of a metal strip (for example made of steel) on which a layer of Ti/TiN was deposited by PVD. The adhesion of the layer is compared between two identical samples, one of which underwent the process for improving adhesion by pulsed current of the invention. The samples are folded through an angle of 170° to place the thin layer under tension.

The following are observed on the control sample:

Axial tearing of the layer according to the curvature of our part.

"Bursting" of the layer at certain points where the tensile force is greatest, especially at the ridges of the part.

The following are observed on the sample treated according to the invention:

An identical structure before bending, with no apparent modification after the bending test.

No bursting of the layer.

In one embodiment, a process for improving the adhesion of a layer on a substrate comprises: depositing a functional or decorative layer on the substrate; applying an electrode above the layer; heating to a determined adhesion temperature; applying an electric voltage between the substrate and the electrode; removing the electrode. The layer can be: a bio-ceramic layer, for example a hydroxyapatite layer, on an implantable device; or an anti-wear layer, for example a TiN or DLC layer, on a cutting tool; or an antireflective layer on a windowpane, an optical glass, or an optical element; or an element of a photovoltaic device; or an element of a display device.

REFERENCE NUMBERS USED IN THE FIGURES 10 electrode
12 space
20 substrate
23 functional or decorative layer
30 voltage source
31 electrode 32 counter electrode
40 chamber
45 thermal and/or electromagnetic energy
50 washing
55 deposition
65 surface activation

The invention claimed is:

1. A process for improving the adhesion of a layer on a substrate, wherein the layer is a functional layer or a decorative layer, the process comprising:
    depositing the layer on the substrate;
    applying after the depositing of the layer an electrode above the layer and in contact with the layer;
    heating to a determined adhesion temperature lower than 300° C.;
    applying an electric voltage between the substrate and the electrode;
    removing the electrode.

2. The process according to claim 1, wherein an interface between the substrate and the layer has a chemical gradient or an oxidation gradient.

3. The process according to claim 1, wherein said electric voltage comprises a pulsed or AC component and a DC component.

4. The process according to claim 3, wherein said pulsed or AC component has a frequency higher than 50 Hz.

5. The process according to claim 4, wherein said pulsed or AC component has a frequency higher than 100 Hz.

6. The process according to claim 1, wherein said substrate is metallic, or ceramic, and the operation of depositing the layer on the substrate includes a physical vapor deposition (PVD) process, or a atomic layer deposition (ALD) process, or a sol-gel process, or a galvanic process.

7. The process according to claim 6, wherein said substrate is made of steel, stainless steel, titanium, platinum, corundum, or zirconium.

8. The process according to claim 1, comprising a step of functionalization by a reactive plasma.

9. The process according to claim 1, wherein the layer is:
    a bio-ceramic layer on an implantable device; or
    an anti-wear layer on a cutting tool; or
    an antireflective layer on a windowpane, an optical glass, or an optical element; or
    an element of a photovoltaic device; or
    an element of a display device.

10. The process according to claim 1, wherein said adhesion temperature is lower than 200° C.

11. The process according to claim 1, comprising a step of functionalization by a reactive plasma of oxygen.

12. The process according to claim 1, wherein the layer is a bio-ceramic layer of hydroxyapatite on an implantable device.

13. The process according to claim 1, wherein the layer is an anti-wear layer of TiN or an anti-wear layer of Diamond-Like Carbon (DLC) on a cutting tool.

* * * * *